(12) United States Patent
Liu et al.

(10) Patent No.: US 9,888,610 B2
(45) Date of Patent: Feb. 6, 2018

(54) VENT STRUCTURE AND ELECTRONIC APPARATUS THEREWITH

(71) Applicant: Wistron Corporation, New Taipei (TW)

(72) Inventors: Qi Liu, New Taipei (TW); Rong-Wei Wu, New Taipei (TW); Ta-Wei Chen, New Taipei (TW)

(73) Assignee: Wistron Corporation, New Taipei (TW)

( * ) Notice: Subject to any disclaimer, the term of this patent is extended or adjusted under 35 U.S.C. 154(b) by 428 days.

(21) Appl. No.: 14/642,710

(22) Filed: Mar. 9, 2015

(65) Prior Publication Data

US 2016/0227670 A1 Aug. 4, 2016

(30) Foreign Application Priority Data

Feb. 4, 2015 (CN) .......................... 2015 1 0059507

(51) Int. Cl.
*H05K 5/00* (2006.01)
*H05K 7/20* (2006.01)
*F24F 13/14* (2006.01)

(52) U.S. Cl.
CPC ...... *H05K 7/20181* (2013.01); *F24F 13/1426* (2013.01)

(58) Field of Classification Search
CPC ................................................ H05K 7/20181
See application file for complete search history.

(56) References Cited

U.S. PATENT DOCUMENTS

2008/0245489 A1* 10/2008 Chuang ..................... E06B 7/08
160/236
2013/0056090 A1 3/2013 Tang

FOREIGN PATENT DOCUMENTS

| CN | 201326585 Y | 10/2009 |
|----|-------------|---------|
| GB | 2435067 A | 8/2007 |
| TW | I276733 | 3/2007 |
| TW | 200730714 A | 8/2007 |

OTHER PUBLICATIONS

Office action dated Sep. 25, 2015 for the Taiwan application No. 104107062, filing date: Mar. 5, 2015, p. 1 line 10-14, p. 2 and p. 3 line 1-4.

* cited by examiner

*Primary Examiner* — Steven B McAllister
*Assistant Examiner* — Jonathan Cotov
(74) *Attorney, Agent, or Firm* — Winston Hsu

(57) ABSTRACT

An electronic apparatus includes a casing, a vent structure on the casing, and an electronic device inside the casing. The vent structure is used for a unidirectional flow and includes a frame and a louver. The louver includes a sheet body and a shaft. The sheet body includes a bent portion, a first and a second portion which oppositely extend from the bent portion and bind together. The shaft passes through a through hole formed by the bent portion and is connected to the frame, so that the sheet body is rotatable. When the louver is located at a closed position, the sheet body covers at least a portion of an opening structure of the frame. The louver is structurally simple and can be made of light material, which is conducive to improving the rotation agility of the louver and reducing the noise probably produced when in operation.

17 Claims, 10 Drawing Sheets

VENT STRUCTURE AND ELECTRONIC APPARATUS THEREWITH

BACKGROUND OF THE INVENTION

1. Field of the Invention

The invention relates to a vent structure and an electronic apparatus, and especially relates to a vent structure for a unidirectional flow and an electronic apparatus having the vent structure.

2. Description of the Prior Art

Conventional electronic apparatuses usually have a heat dissipation system that uses a fan to generate an air flow that flows out of the electronic apparatus from the interior of the electronic apparatus through a vent on the casing of the electronic apparatus for heat dissipation to electronic devices inside. If the vent is not provided with any device capable of closing the vent, when the fan fails or shuts down, an air flow outside the electronic apparatus may enter the electronic apparatus through the vent and interfere with other air flows generated inside the electronic apparatus by other fans leading to a reduction to heat dissipation. For this problem, an electronic apparatus, provided with a unidirectional louver, which only can be opened in one direction, at a vent so that any air flow only can flow through the vent in the same direction and any external air flows cannot enter the electronic apparatus through the vent, is available. In general, the unidirectional louver is normally close, so an air flow inside the electronic apparatus needs to push the louver outward for flowing out of the electronic apparatus. However, the louver is usually formed by a metal sheet in metalworking or by a plastic injection part. Because the metal sheet is usually relatively heavy and the injection part is usually relatively thick, the louver has a certain weight so that it is not easy for a heat dissipation air flow in the interior of the electronic apparatus to move the louver, which reduces the fluidity and heat dissipation efficiency of the heat dissipation air flow. Furthermore, when the louver is open, the heat dissipation air flow blows the louver continuously leading to a loud noise.

SUMMARY OF THE INVENTION

An objective of the invention is to provide a vent structure for a unidirectional flow. A louver of the vent structure is structurally simple and can be made of light material, which is conducive to improving the rotation agility of the louver and reducing the noise probably produced when in operation.

The vent structure of the invention allows air flows to flow through only in one direction. The vent structure includes a frame and a louver. The frame has an opening structure. The louver has a closed position relative to the frame and includes a sheet body and a shaft. The sheet body includes a first portion, a bent portion extending from the first portion, and a second portion extending from the bent portion opposite to the first portion. A surface of the first portion and a surface of the second portion adhere to each other. The bent portion forms a through hole. The shaft extends in a direction and passes through the through hole. The shaft is connected to the frame so that the sheet body is rotatable about the shaft. Therein, when the louver is located at the closed position, the sheet body covers at least a portion of the opening structure.

Another objective of the invention is to provide an electronic apparatus having the vent structure of the invention. The electronic apparatus uses the vent structure to prevent any air flow outside the electronic apparatus from entering the interior of the electronic apparatus and interfering with any internal air flow such as heat dissipation air flows. Similarly, the louver of the vent structure is structurally simple and can be made of light material, which is conducive to improving the rotation agility of the louver and reducing the noise probably produced when in operation.

The electronic apparatus of the invention includes a casing, an electronic device, and the vent structure mentioned above. The casing forms an accommodating space. The electronic device is disposed in the accommodating space. The frame of the vent structure is disposed on the casing. The accommodating space communicates with an exterior of the casing through the opening structure. The sheet body is outward rotatable relative to the casing.

Compared with the prior art, the vent structure of the invention has the structurally simple louver. The louver can be made of light materials, for example by folding a plastic thin sheet (e.g. a sheet of Mylar with a thickness of 0.05 mm), binding the folded portions, and inserting a thin metal rod through the bent portion of the plastic thin sheet. The structure of the louver is conducive to improving the rotation agility of the louver and reducing the noise probably produced when in operation.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
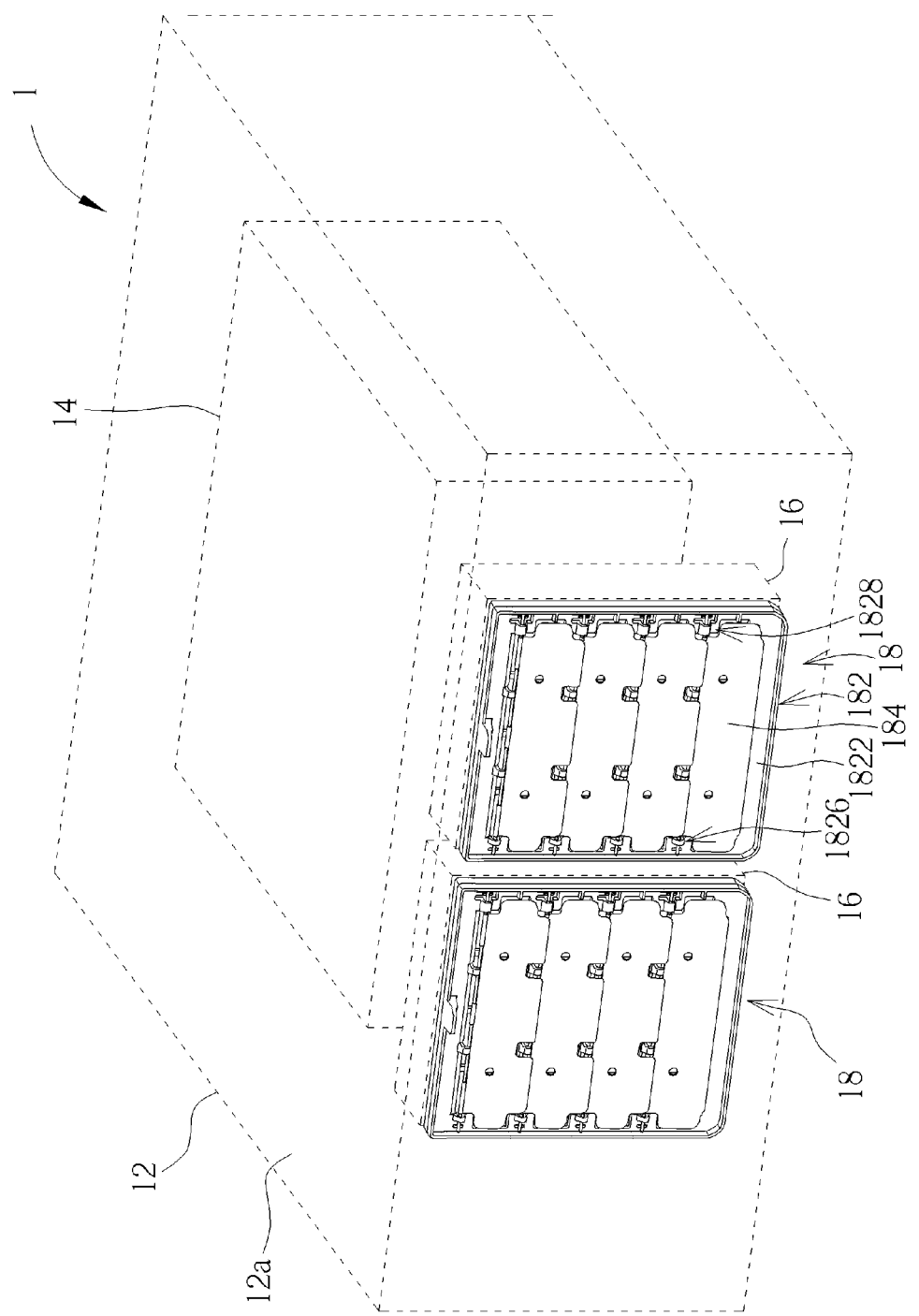
FIG. 1 is a schematic diagram illustrating an electronic apparatus of an embodiment according to the invention.

Please refer to FIG. 1 that is a schematic diagram illustrating an electronic apparatus 1 of an embodiment according to the invention. The electronic apparatus 1 includes a casing 12, an electronic device 14, two fans 16, and two vent structures 18; therein, the casing 12, the electronic device 14, and the fans 16 are shown by their profiles in dashed lines. The casing 12 forms an accommodating space 12a. The electronic device 14 is disposed in the accommodating space 12a. The two vent structures 18 are disposed adjacent to each other on the casing 12. The two fans 16 are disposed adjacent to the two vent structure 18 respectively. The vent structures 18 allow air flows to flow through only in one direction, so that an air flow generated by the fan 16 can flow out of the casing 12 through the corresponding vent structure 18 and the vent structures 18 can prevent any air flow outside the casing 12 from entering the casing 12 through the vent structures 18.

Figure 2:
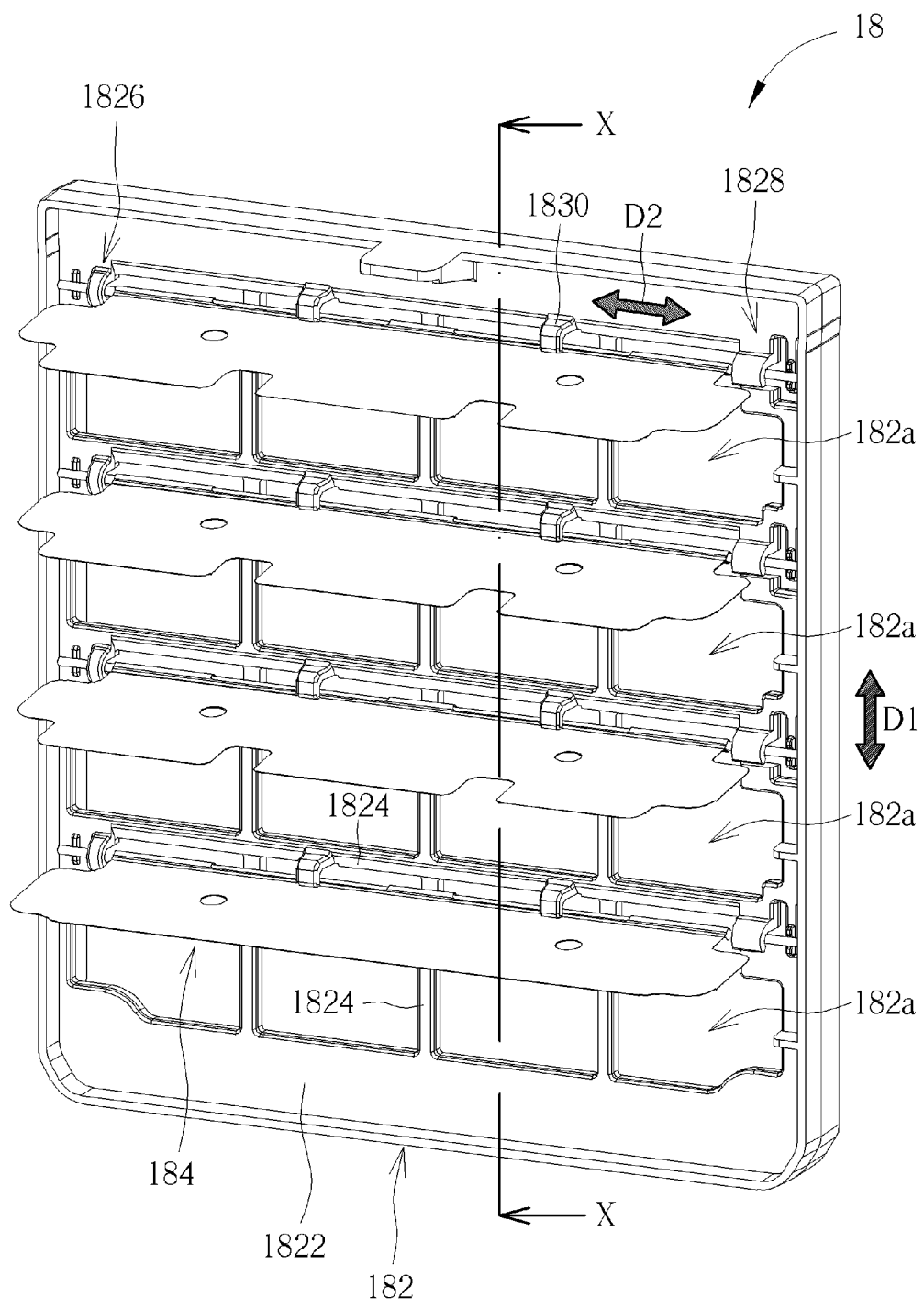
FIG. 2 is a schematic diagram illustrating a vent structure of the electronic apparatus in FIG. 1 with being open.
Figure 3:
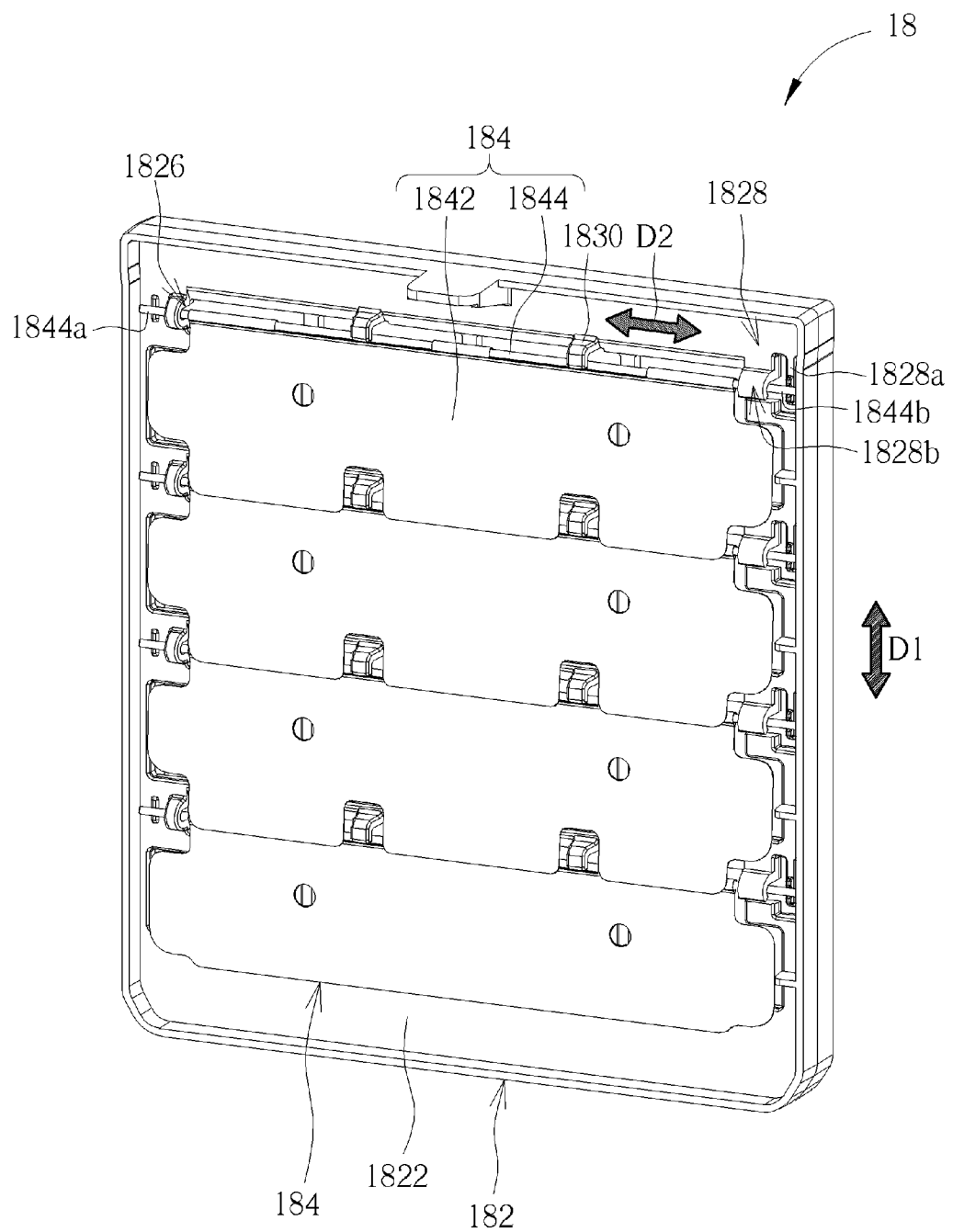
FIG. 3 is a schematic diagram illustrating the vent structure of the electronic apparatus in FIG. 1 with being closed.
Figure 4:
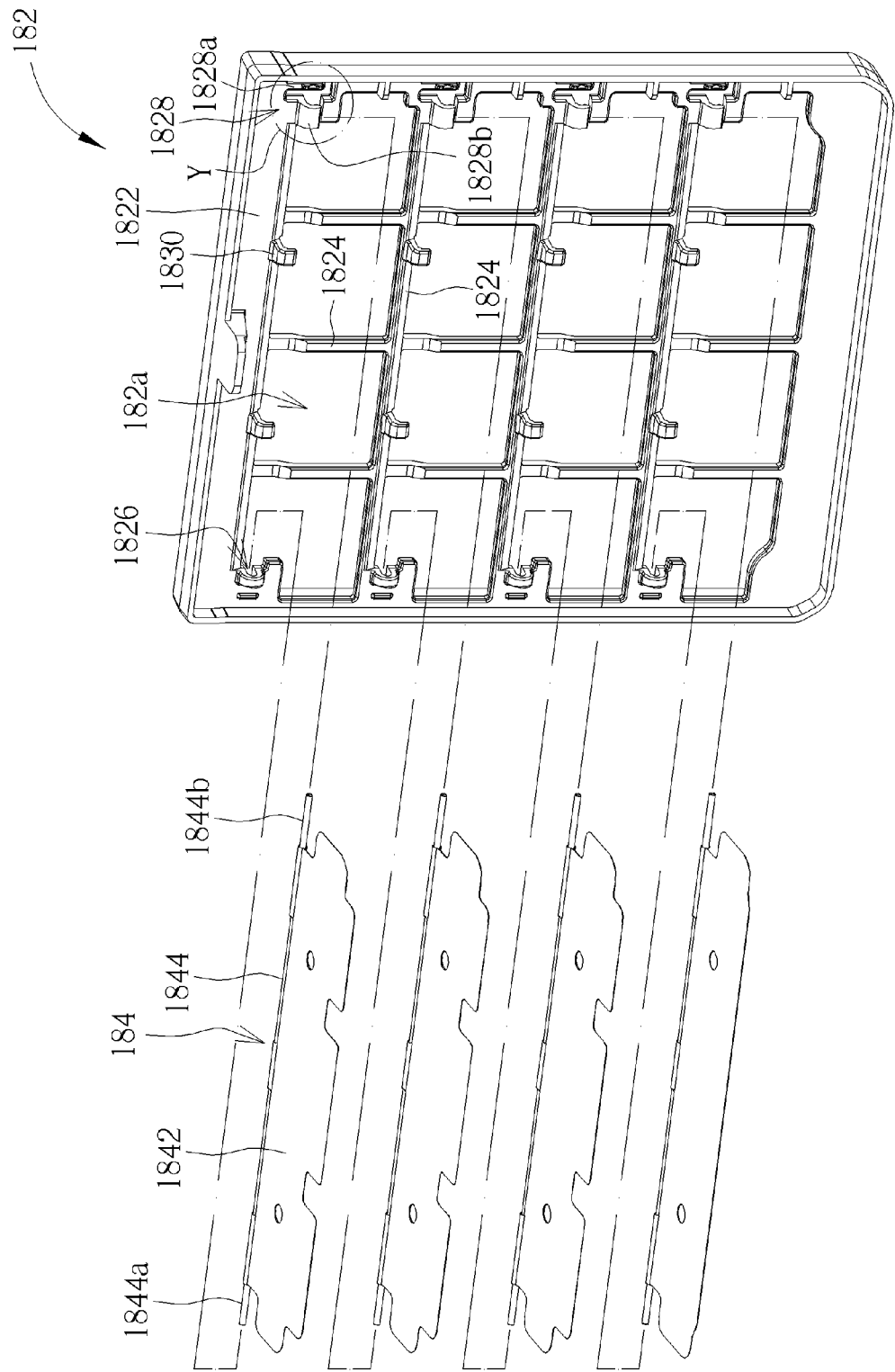
FIG. 4 is an exploded view of the vent structure of the electronic apparatus in FIG. 1.

Please also refer to FIGS. 2 to 4. FIG. 2 is a schematic diagram illustrating the vent structure 18 that is open. FIG. 3 is a schematic diagram illustrating the vent structure 18 that is closed. FIG. 4 is an exploded view of the vent structure 18. The vent structure 18 includes a frame 182 and four louvers 184. The four louvers 184 are vertically arranged (i.e. disposed in an arrangement direction D1) and connected to the frame 182. Therein, for matching the structure of the frame 182, the lower edge profile of the lowest louver 184 is a little different to that of the other louvers 184; however, the four louvers 184 have the same movement mechanism, and they will use the same notation through the description. In the embodiment, the louver 184 has an open position and a closed position relative to the frame 182 and is rotatable upward relative to the frame 182. Therein, the four louvers 184 can be rotated upward to be located at the open position, so that the vent structure 18 is open, as shown by FIG. 2; the four louvers 184 can be rotated downward to be located at the closed position, so that the vent structure 18 is closed, as shown by FIG. 3.

Figure 5:
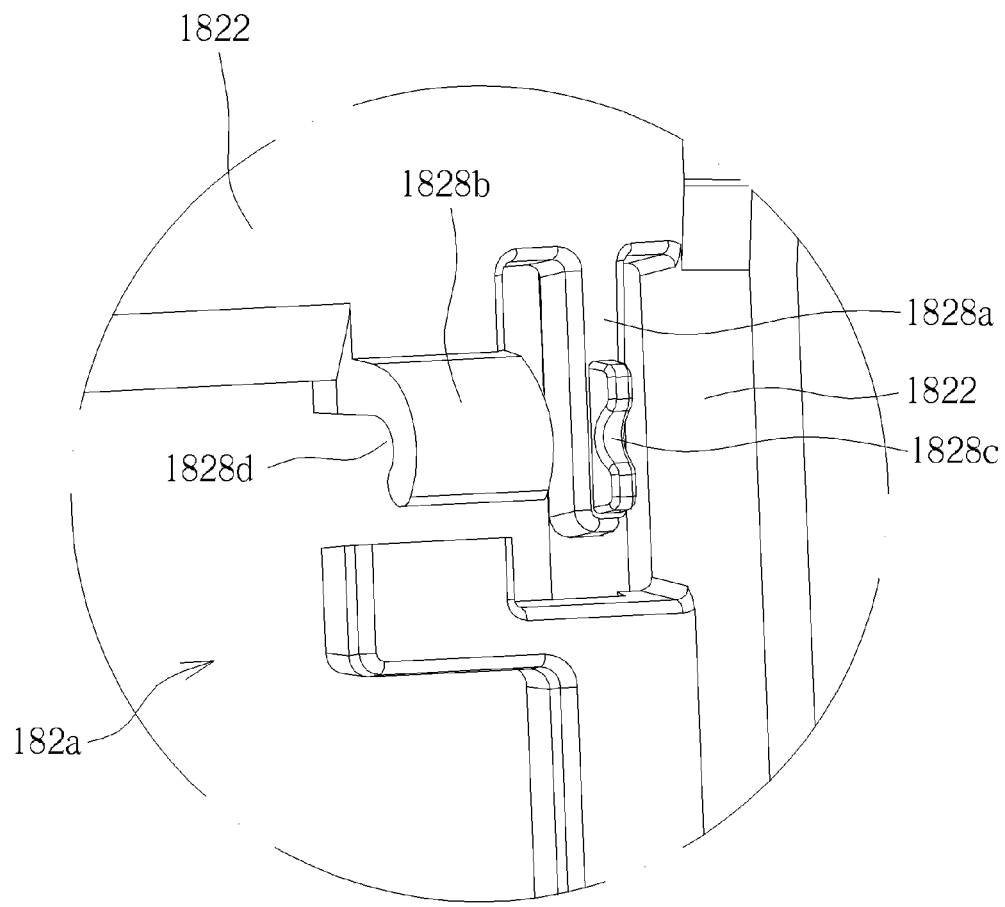
FIG. 5 is an enlarged view of a shaft bearing structure at a circle Y in FIG. 4.

The frame 182 has an opening structure 182a and includes a rim 1822 and a plurality of ribs 1824 connected to the rim 1822. The ribs 1824 are arranged in both vertical and horizontal directions, which is conducive to an improvement in the rigidity of the frame 182. The rim 1822 and the ribs 1824 form the opening structure 182a. In practice, the location and quantity of the ribs 1824 depends on the size and required rigidity of the rim 1822. For example, if the 1822 is relatively small, the frame 182 may be provided with one rib 1824 or none; for the latter, the opening structure 182a is formed directly by the rim 1822. The accommodating space 12a communicates with the exterior of the casing 12 through the opening structure 182a. The frame 182 includes a shaft hole 1826 and a shaft bearing structure 1828 oppositely disposed on the rim 1822 for each louver 184. Therein, for the shaft bearing structure 1828, please also refer to FIG. 5 that is an enlarged view of the shaft bearing structure 1828 at the circle Y in FIG. 4; the view point of FIG. 5 is different to that of FIG. 4. The shaft bearing structure 1828 includes a resilient cantilever 1828a and a holding arm 1828b. The resilient cantilever 1828a has an indentation 1828c substantially located between the fixed end and free end thereof. The holding arm 1828b has a curved recess 1828d.

The louver 184 includes a sheet body 1842 and a shaft 1844 connected to the sheet body 1842. The louver 184 is pivotally connected to the shaft hole 1826 and the shaft bearing structure 1828 by the two end portions 1844a and 1844b of the shaft 1844 respectively, so that the sheet body 1842 is rotatable relative to the frame 182 and outward rotatable relative to the casing 12. Therein, the end portion 1844a of the shaft 1844 is inserted into the shaft hole 1826, and the shaft 1844 and the shaft bearing structure 1828 are pivotally connected by the end portion 1844b of the shaft 1844 being held by the indentation 1828c and the curved recess 1828d. In principle, projections of the indentation 1828c and the curved recess 1828d in an extension direction D2 (perpendicular to the arrangement direction D1) of the shaft 1844 are opposite, so that the resilient cantilever 1828a and the holding arm 1828b hold the end portion 1844b at two opposite sides of the shaft 1844 relative to the extension direction D2. In the embodiment, the resilient cantilever 1828a and the holding arm 1828b are disposed adjacent to each other, which can enhance the holding of the shaft bearing structure 1828 to the end portion 1844b; however, the invention is not limited thereto. Furthermore, in the embodiment, the louver 184 is pivotally connected to the rim 1822 by the two end portions 1844a and 1844b of the shaft 1844, but the invention is not limited thereto. For example, it is also practicable that the louver 184 is pivotally connected to the frame 182 by a relatively middle portion of the shaft so that the louver 184 is rotatable relative to the frame 182; for this case, a structure for pivotally connected to the shaft 1844 (e.g. the above-mentioned shaft bearing structure 1828) is disposed on the rim 1822 or the rib 1824 correspondingly. In addition, when the louver 184 is located at the open position, the vent structure 18 is open, and the accommodating space 12a is at a condition of communicating with the exterior of the casing 12 through the opening structure 182a. When the louver 184 is located at the closed position, the sheet body 1842 covers at least a portion of the opening structure 182a. In the embodiment, when the vent structure 18 is closed, the opening structure 182a is substantially covered by the four sheet bodies 1842, but the invention is not limited to that the opening structure 182a is sealed.

Furthermore, the frame 182 includes two limitation structures 1830 for each louver 184. The limitation structures 1830 corresponding to the highest louver 184 are disposed on the rim 1822; the other limitation structures 1830 are disposed on the rib 1824. When the louver 184 rotates upward relative to the frame 182, the corresponding limitation structures 1830 will stop the rotating of the louver 184 so that a rotation angle of the louver 184 is limited. In practice, the louver 184 can be stopped by a singular limitation structure 1830; the invention is not limited to the embodiment of a plurality of limitation structures 1830. As shown by FIG. 2, when the vent structure 18 is open, the four louvers 184 are located at the open position and stopped by the limitation structures 1830, so that the accommodating space 12a is at a condition of communicating with the exterior of the casing 12. Please also refer to FIG. 6 that is a sectional view of the vent structure 18 along the line X-X in FIG. 2; therein, the fan 16 is shown by its profile in dashed lines, and the louver 184 shown by dashed lines is located at the closed position (as shown by FIG. 3). When the vent structure 18 is closed, the four louver 184 are located at the closed position (as shown by the dashed lines in FIG. 6); therein, the relatively upper louver 184 overlaps the relatively lower louver 184 disposed adjacent thereto. That is, the relatively lower louver 184 can stop the relatively upper louver 184 from rotating toward the interior of the casing 12 (i.e. toward the right side of the vent structure 18 in FIG. 6), achieving the purpose of the vent structure 18 allowing air flows (e.g. the air flow from the right side to the left side in FIG. 6) to flow through only in one direction.

Therefore, when the fan 16 is driven to generate an air flow 16a (as represented by a hollow arrow in FIG. 6), the air flow 16a can push out the sheet body 1842 (i.e. the sheet body 1842 in FIG. 6 rotating clockwise about the shaft 1844) and flow out of the casing 12. In general, the air flow 16a can flows out of the casing 12 from the accommodating space 12a through the fan 16 and the vent structure 18. Any external air flow will be blocked from entering the accommodating space 12a through the vent structure 18 when the louvers 184 are located at the closed position (e.g. the corresponding fan 16 not generating an air flow to push out the sheet bodies 1842. In a practical use of FIG. 1, for example, because of the one-way flowing mechanism of vent structure 18, when the right fan 16 fails, the right vent structure 18 can be closed naturally for preventing any air flow outside the casing 12 from entering the casing 12 and influencing the air flow generated by the left fan 16.

Furthermore, in the embodiment, an allowable rotation angle of the sheet body 1842 relative to the frame 182 is limited by the limitation structure 1830 and the louver 184 disposed lower and adjacent to the sheet body 1842. In principle, a small allowable rotation angle impairs the flowing of the corresponding air flow 16a; a larger allowable rotation angle impairs the flowing of the adjacent air flow 16a corresponding to the adjacent sheet body 1842. In the embodiment, when the sheet body 1842 rotates relative to the frame 182 and is then stopped by the limitation structure 1830, the louver 184 is located at the open position (as shown by dashed lines in FIG. 6). An angle A1 in which the sheet body 1842 rotates relative to the frame 182 from the louver 184 being located at the closed position to the louver 184 being located at the open position is less than 90 degrees. In practice, by a modification to the limitation structure 1830, the angle A1 can be limited to be less than 80 degrees.

Figure 6:
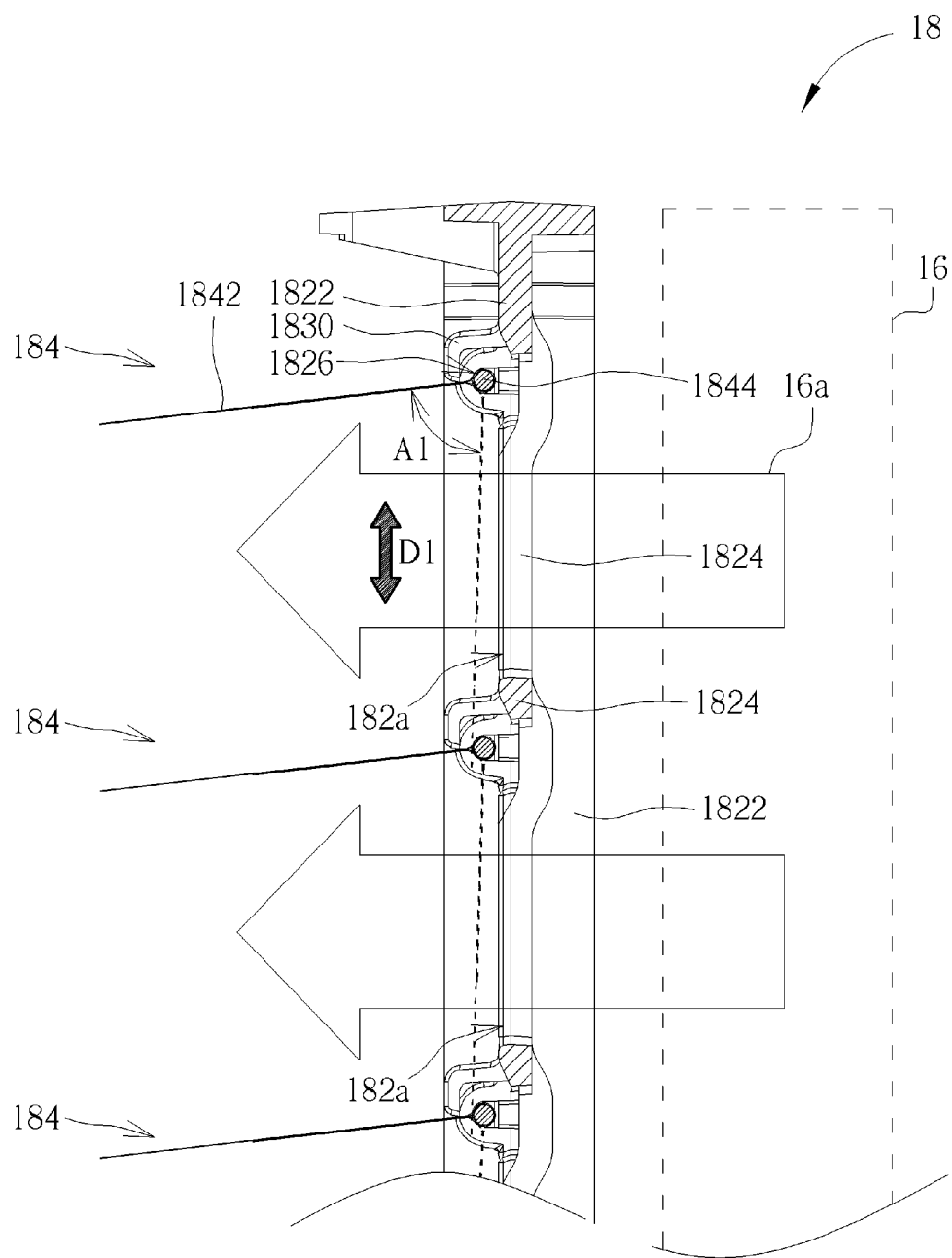
FIG. 6 is a sectional view of the vent structure in FIG. 2 along the line X-X.
Figure 7:
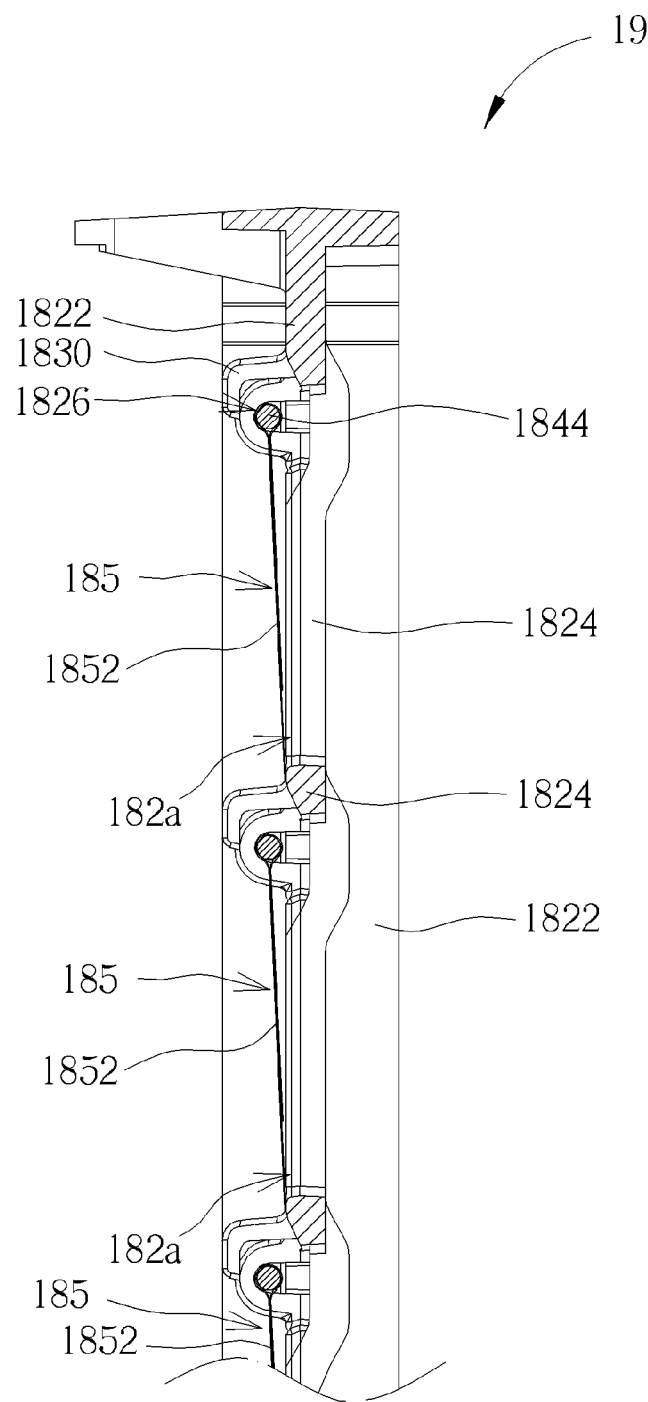
FIG. 7 is a sectional view of a vent structure of another embodiment.

In addition, in the embodiment, the open position is defined as where the louver 184 is located when the limitation structure 1830 stops the sheet body 1842; the closed position is defined as where the louver 184 is located when the sheet body 1842 is stopped by the adjacent lower louver 184 (e.g. for the three relative upper louvers 184) or by the rim 1822 (e.g. for the lowest louver 184). However, in an application, in principle, once the louver 184 departs from the closed position, the vent structure 18 is opened and has the function of allowing the air flow 16a to pass through. When the four louvers 184 are located at the closed position, any two adjacent louvers 184 overlaps, but the invention is not limited thereto. For example, the three upper louvers 184 in FIG. 6 are replaced with the louvers 185 as shown in FIG. 7. The sheet body 1852 of the louver 185 has a shorter length in the arrangement direction D1, so that when the louvers 185 are located at the closed position, any two adjacent louvers 185 will not overlap (as shown by FIG. 7). Therein, the sheet bodies 1852 of the three upper louvers 185 are stopped by the ribs 1824; the sheet body 1842 of the lowest louver 184 is still stopped by the rim 1822 (as shown in FIG. 3). The vent structure 19 in FIG. 7 also has a one-way flowing mechanism equivalent to that of the vent structure 18.

Figure 8:
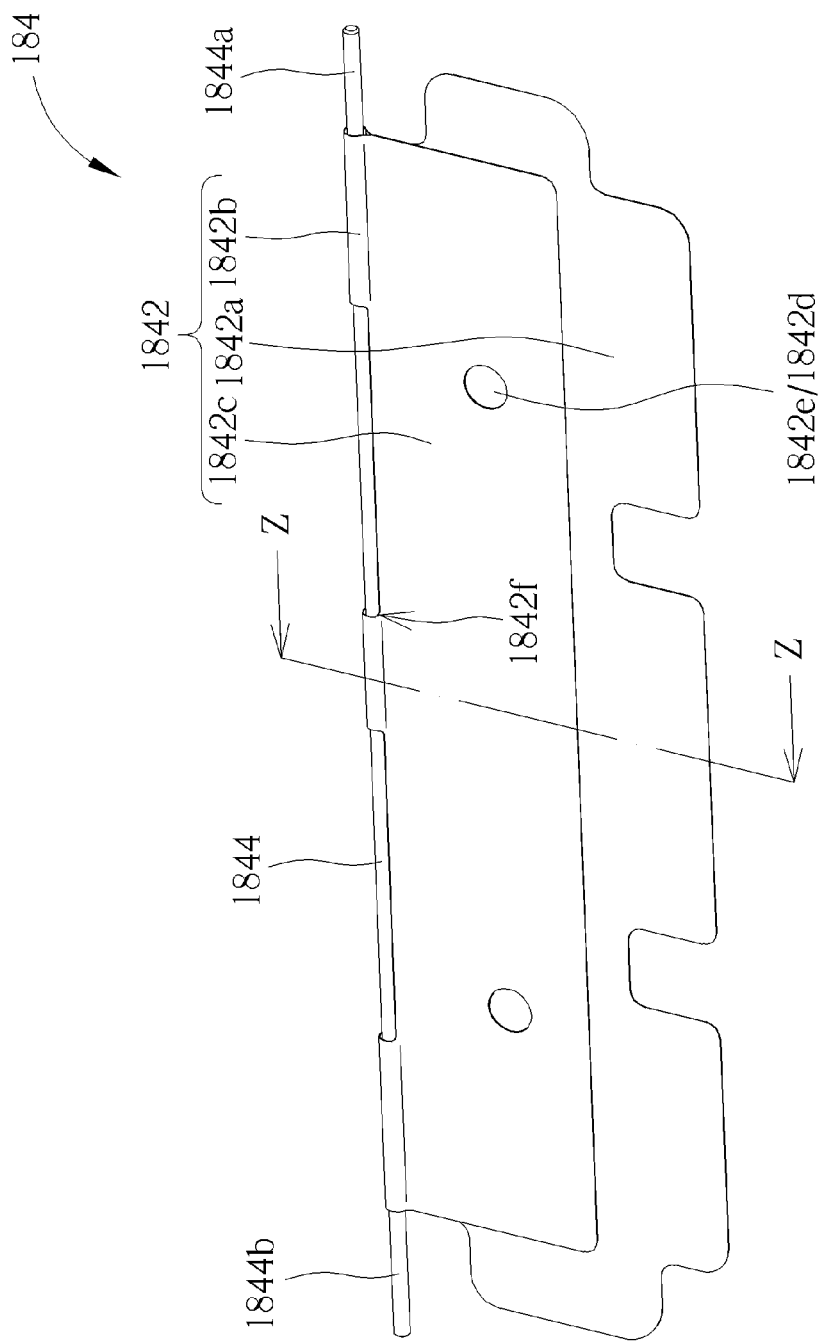
FIG. 8 is a schematic diagram illustrating a louver of the vent structure of the electronic apparatus in FIG. 1.
Figure 9:
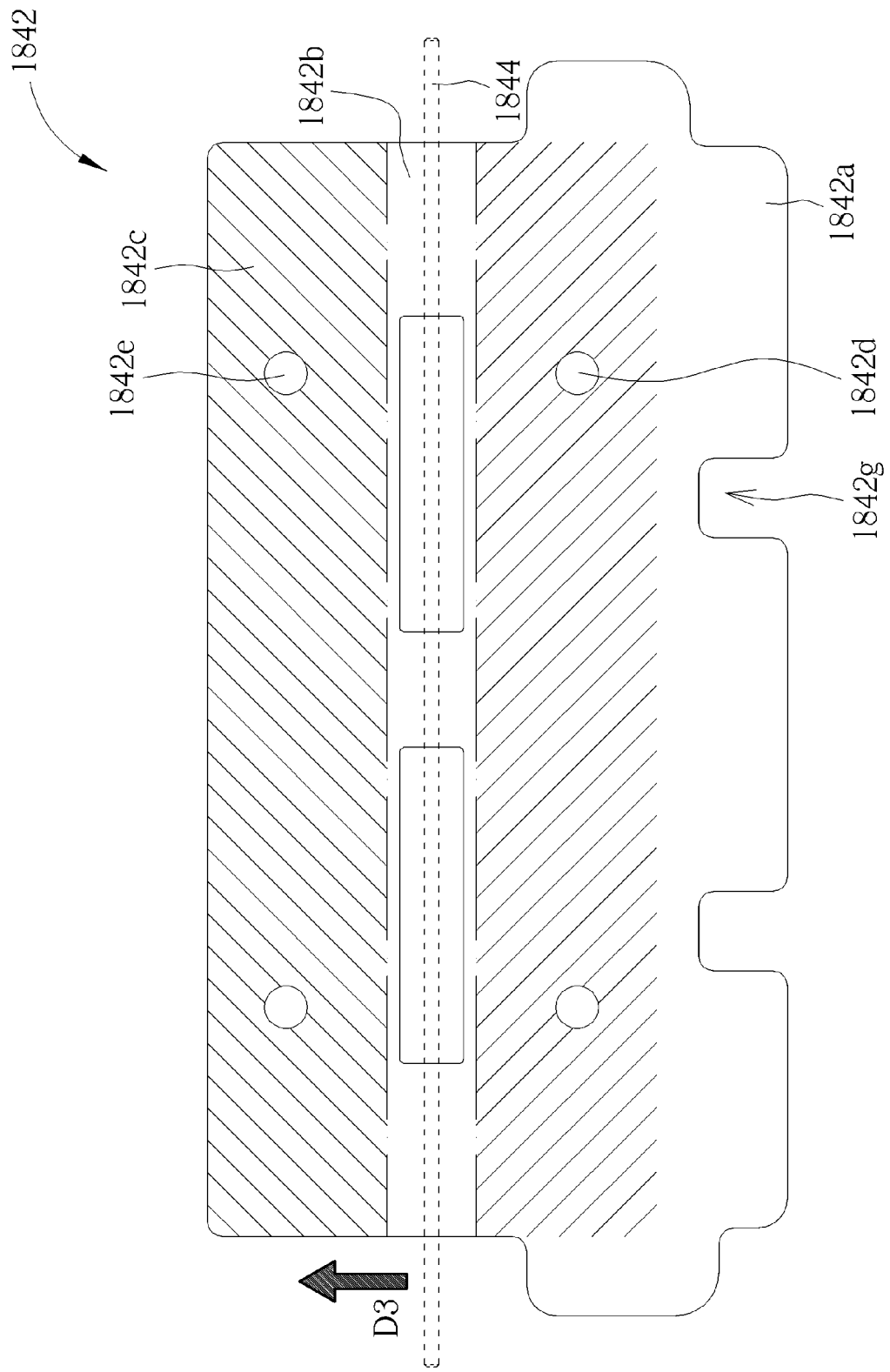
FIG. 9 is a developed view of a sheet body of the louver in FIG. 8.
Figure 10:
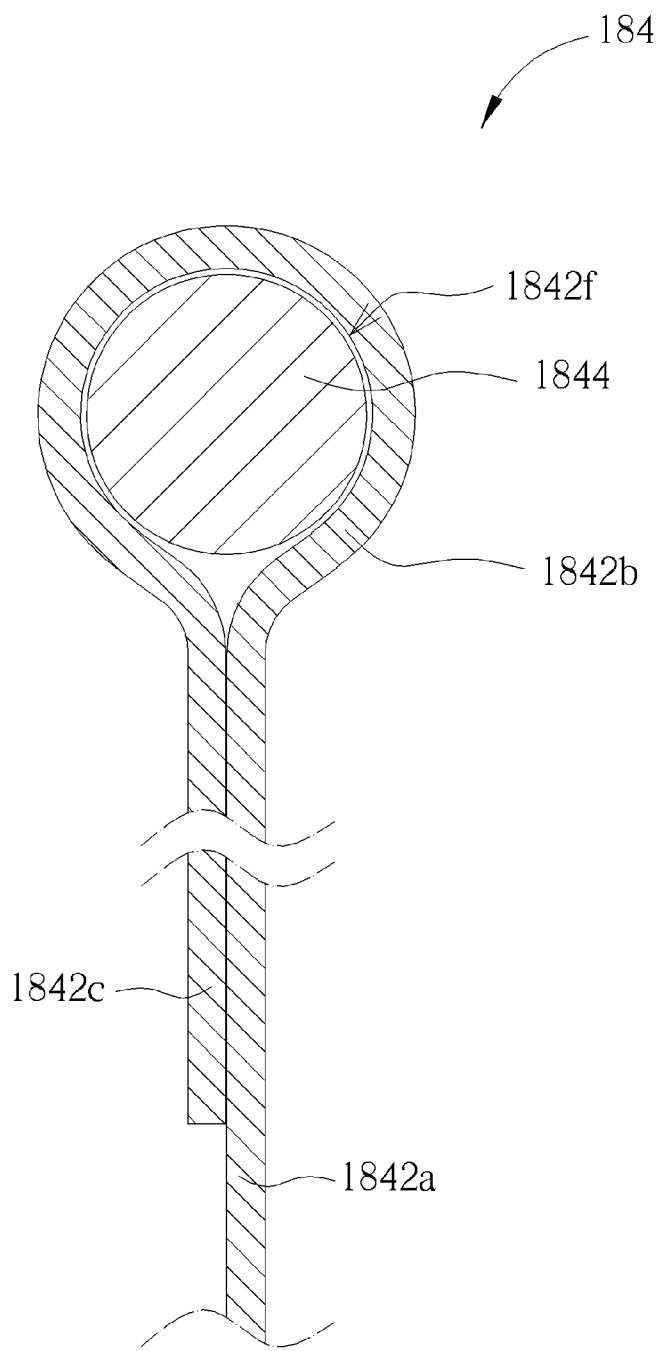
FIG. 10 is a sectional view of the louver in FIG. 8 along the line Z-Z.

Please refer to FIG. 8 to FIG. 10. FIG. 8 is a schematic diagram illustrating the louver 184, of which the view point is different to that of FIG. 4. FIG. 9 is a developed view of the sheet body 1842 of the louver 184. FIG. 10 is a sectional view of the louver 184 along the line Z-Z in FIG. 8; therein, because the sheet body 1842 in the embodiment is much thinner, the sheet body 1842 is shown to be magnified in thickness in FIG. 10 for a convenience of illustrating the structure of the sheet body 1842. In the embodiment, the sheet body 1842 is formed by cutting a sheet material and bending it. The sheet body 1842 includes a first portion 1842a, a bent portion 1842b extending from the first portion 1842a, and a second portion 1842c extending from the bent portion 1842b opposite to the first portion 1842a. In the view point of FIG. 9, the first portion 1842a, the bent portion 1842b, and the second portion 1842c are connected and extend in an extension direction D3 in order; therein, the boundaries between the above three portions are indicated by two chain lines. A surface of the first portion 1842a and a surface of the second portion 1842c can adhere to each other (e.g. using an adhesive) by folding the cut sheet material for the sheet body 1842; therein, the area of the adhering surfaces is shown by hatching lines. In practice, the first portion 1842a and the second portion 1842c can adhere to each other through only a few small areas of the surfaces. In addition, in the embodiment, the first portion 1842a has two first positioning apertures 1842d; the second portion 1842c has two second positioning apertures 1842e correspondingly. During the folding for the sheet body 1842, the first positioning apertures 1842d and the second positioning apertures 1842e function as a positioning for the first portion 1842a and the second portion 1842c (e.g. by a fixture with positioning posts that pass through the first positioning apertures 1842d and the second positioning apertures 1842e for locating the first portion 1842a and the second portion 1842c), so that after the sheet body 1842 is formed, the first positioning apertures 1842d are aligned with the corresponding second positioning apertures 1842e (as shown by FIG. 8).

Furthermore, during the folding for the sheet body 1842, the shaft 1844 (shown by dashed lines in FIG. 9) can be placed at the bent portion 1842b. After the sheet body 1842 is formed, the bent portion 1842b forms a through hole 1842f. The shaft 1844 passes through the through hole 1842f in the extension direction D2. In practice, it is practicable to insert the shaft 1844 into the through hole 1842f formed by the bent portion 1842b after the sheet body 1842 is formed. In addition, in the embodiment, as shown by FIG. 10, the inner diameter of the through hole 1842f is slightly larger than the outer diameter of the shaft 1844, so in principle, the sheet body 1842 can rotate relative to the shaft 1844. For this case, it is unnecessary for the two end portions 1844a and 1844b of the shaft 1844 to be pivotally connected with the frame 182. For example, the two end portions 1844a and 1844b of the shaft 1844 can be just fixed on the frame 182, and the sheet body 1842 still can rotate relative to the frame 182. In practice, the sheet body 1842 can clamp the shaft 1844 by the through hole 1842f or the shaft 1844 adhere into the through hole 1842f with an adhesive, so that the shaft 1844 and the sheet body 1842 can rotate together. In addition, in the embodiment, the lower edge of the first portion 1842a of the sheet body 1842 has at least one indentation 1842g for preventing the sheet body 1842 from interfering with the limitation structures 1830 when the louver 184 is located at the closed position (e.g. the three upper louvers 184 in FIG. 3 can use the indentations 1842g to avoid any interference with the limitation structures 1830).

As discussed above, the vent structures 18 and 19 according to the invention have louvers 184 and 185 with simple structure. In practice, the louvers 184 and 185 can be made of light materials, e.g. plastic thin sheets with a quite thin thickness. For example, a sheet of Mylar with a thickness of 0.05 mm (or any other thinner films) is used for the sheet bodies 1842 and 1852. The sheet of Mylar is folded and joined, a metal thin rod (e.g. the above shaft 1844) is placed inside the bent portion of the folded sheet of Mylar, and the louver 184 or 185 is therefore formed. Therein, the thickness of each of the first portion 1842a and the second portion 1842c is substantially 0.05 mm; the thickness of the first portion 1842a and the second portion 1842c after joined together is substantially 0.10 mm. When a thinner film is used for the sheet bodies 1842 and 1852, the above thicknesses can be smaller. Furthermore, in general, an adhesive joining the first portion 1842a and the second portion 1842c is much thinner than the first portion 1842a and the second portion 1842c, so the thickness of the adhesive can be ignored. In practice, the above plastic thin sheet has a small specific weight, e.g. less than or equal to 1.2. Therefore, compared with the louver in the prior art formed by a metal sheet in metalworking or by a plastic injection part, the louvers 184 and 185 are relatively light. Because the louvers 184 and 185 are light, the air flow 16*a* generated by the fan 16 can push out the sheet bodies 1842 and 1852 easily, so that the vent structures 18 and 19 are opened (i.e. the louvers 184 and 185 departing from the closed position, but not limited to reaching the open position). In other words, when the pressure of the air flow 16*a* is low, the vent structures 18 and 19 still can perform ventilation, which solves the problem in the prior art that a low-pressure air flow can hardly push out the louver formed by a metal sheet in metalworking or by a plastic injection part. Similarly, because the louvers 184 and 185 are light, after the sheet bodies 1842 and 1852 are pushed out, a noise, even if produced by the air flow 16*a* blows the sheet bodies 1842 and 1852 (e.g. produced by a friction due to the rotation of the louvers 184 and 185, by a friction between the air flow 16*a* and the sheet bodies 1842 and 1852, or a vibration of the sheet bodies 1842 and 1852), is much smaller, which solves the problem in the prior art that the louver formed by a metal sheet in metalworking or by a plastic injection part is relatively heavy so that an air flow blows the louver continuously leading to a loud noise. Furthermore, because the louvers 184 and 185 are light, a noise, produced when the sheet bodies 1842 and 1852 rotate downward to hit the sheet bodies 1842 and 1852 of the lower louvers 184 and 185, the rim 1822, or the ribs 1824 (e.g. due to a disappearance of the air flow 16*a* or an external air flow blowing the sheet bodies 1842 and 1852), is much smaller. Briefly, the structure of the louvers 184 and 185 of the vent structures 18 and 19 according to the invention is conducive to improving the rotation agility of the louvers 184 and 185 and reducing the noise probably produced when the louvers 184 and 185 are in operation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A vent structure for a unidirectional flow, the vent structure comprising:
    a frame having an opening structure; and
    a first louver having a closed position relative to the frame, the first louver comprising:
        a sheet body comprising a first portion, a bent portion extending from the first portion, and a second portion extending from the bent portion opposite to the first portion, a surface of the first portion and a surface of the second portion adhering to each other, the bent portion forming a through hole, the first portion having a first positioning aperture, the second portion having a second positioning aperture, the first positioning aperture being aligned with the second positioning aperture; and
        a shaft extending in a direction and passing through the through hole, the shaft being connected to the frame so that the sheet body is rotatable about the shaft;
    wherein when the first louver is located at the closed position, the sheet body covers at least a portion of the opening structure.

2. The vent structure of claim 1, wherein the frame comprises a rim and at least one rib connected to the rim, two end portions of the shaft are pivotally connected to the rim, the rim and the at least one rib forms the opening structure, and when the first louver is located at the closed position, the sheet body is stopped by the rim or the rib.

3. The vent structure of claim 2, wherein the frame comprises a shaft hole and a shaft bearing structure that are oppositely disposed, the shaft bearing structure comprises a resilient cantilever and a holding arm, the resilient cantilever has an indentation, the holding arm has a curved recess, one of the end portions of the shaft is inserted into the shaft hole, and the shaft and the shaft bearing structure are pivotally connected by the other end portion of the shaft being held by the indentation and the curved recess.

4. The vent structure of claim 3, wherein the frame comprises a limitation structure, when the sheet body rotates relative to the frame to be stopped by the limitation structure, the first louver is located at an open position, and an angle in which the sheet body rotates relative to the frame from the closed position to the open position is less than 90 degrees.

5. The vent structure of claim 4, wherein the angle is less than 80 degrees.

6. The vent structure of claim 5, wherein the limitation structure is disposed on the rim or the rib.

7. The vent structure of claim 6, further comprising a second louver identical to the first louver, wherein the first louver and the second louver are rotatable upward relative to the frame, the second louver is disposed below the first louver, and when the first louver is located at the closed position, the first louver overlaps the second louver.

8. The vent structure of claim 7, wherein a specific weight of the sheet body is less than or equal to 1.2, and a thickness of the first portion and the second portion is less than or equal to 0.05 mm.

9. An electronic apparatus, comprising:
    a casing forming an accommodating space;
    a vent structure for an unidirectional flow, the vent structure comprising:
        a frame disposed on the casing and having an opening structure, the accommodating space communicating with an exterior of the casing through the opening structure; and
        a first louver having a closed position relative to the frame, the first louver comprising:
            a sheet body comprising a first portion, a bent portion extending from the first portion, and a second portion extending from the bent portion opposite to the first portion, a surface of the first portion and a surface of the second portion adhering to each other, the bent portion forming a through hole, the first portion having a first positioning aperture, the second portion having a second positioning aperture, the first positioning aperture being aligned with the second positioning aperture; and
            a shaft extending in a direction and passing through the through hole, the shaft being connected to the frame so that the sheet body is rotatable about the shaft and outward rotatable relative to the casing, wherein when the first louver is located at the closed position, the sheet body covers at least a portion of the opening structure; and
    an electronic device disposed in the accommodating space.

10. The electronic apparatus of claim 9, wherein the frame comprises a rim and at least one rib connected to the rim, two end portions of the shaft are pivotally connected to the rim, the rim and the at least one rib forms the opening structure, and when the first louver is located at the closed position, the sheet body is stopped by the rim or the rib.

11. The electronic apparatus of claim 10, wherein the frame comprises a shaft hole and a shaft bearing structure that are oppositely disposed, the shaft bearing structure comprises a resilient cantilever and a holding arm, the resilient cantilever has an indentation, the holding arm has a curved recess, one of the end portions of the shaft is inserted into the shaft hole, and the shaft and the shaft bearing structure are pivotally connected by the other end portion of the shaft being held by the indentation and the curved recess.

12. The electronic apparatus of claim 11, wherein the frame comprises a limitation structure, when the sheet body rotates relative to the frame to be stopped by the limitation structure, the first louver is located at an open position, and an angle in which the sheet body rotates relative to the frame from the closed position to the open position is less than 90 degrees.

13. The electronic apparatus of claim 12, wherein the angle is less than 80 degrees.

14. The electronic apparatus of claim 13, wherein the limitation structure is disposed on the rim or the rib.

15. The electronic apparatus of claim 14, wherein the vent structure comprises a second louver identical to the first louver, the first louver and the second louver are rotatable upward relative to the frame, the second louver is disposed below the first louver, and when the first louver is located at the closed position, the first louver overlaps the second louver.

16. The electronic apparatus of claim 15, wherein a specific weight of the sheet body is less than or equal to 1.2, and a thickness of the first portion and the second portion is less than or equal to 0.05 mm.

17. The electronic apparatus of claim 16, further comprising a fan disposed adjacent to the vent structure, wherein the fan is used for generating an air flow that flows out of the casing from the accommodating space through the vent structure.

* * * * *